United States Patent
Lee et al.

(10) Patent No.: US 6,673,718 B1
(45) Date of Patent: Jan. 6, 2004

(54) METHODS FOR FORMING ALUMINUM METAL WIRINGS

(75) Inventors: Jong-Myeong Lee, Sungnam (KR); In-Sun Park, Yongin (KR); Hyeon-Deok Lee, Seoul (KR); Jong-Sik Chun, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/305,244

(22) Filed: Nov. 27, 2002

(51) Int. Cl.[7] .............................................. H01L 21/44
(52) U.S. Cl. ..................... 438/677; 438/626; 438/627; 438/628; 438/629; 438/641; 438/643; 438/644; 438/645; 438/646; 438/688
(58) Field of Search ................................ 438/626, 627, 438/628, 629, 641, 643, 644, 645, 646, 677, 688

(56) References Cited

U.S. PATENT DOCUMENTS 6,001,420 A * 12/1999 Mosely et al. ............... 427/258
6,376,355 B1  4/2002 Yoon et al. ................... 438/618

* cited by examiner

Primary Examiner—George Fourson
Assistant Examiner—Julio J. Maldonado
(74) Attorney, Agent, or Firm—Volentine Francos, PLLC

(57) ABSTRACT

An aluminum wiring is selectively formed within a contact hole or groove of a substrate. An intermediate layer which includes nitrogen is formed over the main surface of a substrate and over the interior surface of the contact hole or groove. A first surface portion of the intermediate layer which is located over the main surface of the substrate is treated with a plasma to form a passivity layer at the first surface portion of the intermediate layer. Then, without an intervening vacuum break, an aluminum film is CAD deposited only over a second surface portion of the intermediate layer which is located over the interior surface of the contact hole or recess. The plasma treatment of the first surface portion of the intermediate layer prevents the CAD deposition of the aluminum film over the first surface portion of the intermediate layer.

46 Claims, 7 Drawing Sheets

METHODS FOR FORMING ALUMINUM METAL WIRINGS

BACKGROUND OF THE INVENTION

1. Field of the Invention

The present invention generally relates to the manufacture of semiconductor integrated circuit devices, and more particularly, the present invention relates to methods of forming metal wiring of semiconductor integrated circuit devices.

2. Description of the Related Art

The proper formation of metal wiring is an increasingly important aspect of the manufacture of semiconductor devices. The resistance of the metal wiring should as low as possible to allow for the rapid transmission of electrical signals. However, the circuit designer must balance low resistance against economic efficiencies and device reliability. In this regard, aluminum is generally regarded as a favorable material for achieving a reliable wiring of low resistance at relatively low cost, and accordingly, aluminum has been widely adopted in the formation of the metal wiring of semiconductor devices.

In the meantime, as the degree of integration of components of semiconductor devices continues to increase, the width and the thickness of the metal wiring have decreased. In addition, contact holes and recesses formed in the semiconductor substrate and insulating layers have become smaller and smaller, resulting in increased aspect ratios. The development of techniques for reliably and completely filling the holes having increased aspect ratios has thus become a significant factor in the ability to realize further increases in device integration.

Al-CVD (aluminum chemical vapor deposition) is a technique which is used to fill contact holes and recesses with a low resistance aluminum material. Al-CVD processes are classified into two types, i.e. blanket-Al deposition processes and selective-Al deposition processes. In blanket-Al deposition processes, aluminum is deposited on the entire surface of the wafer so as to fill the contact holes. This process relies in part on the favorable step coverage characteristics of aluminum. However, when the aluminum is deposited to certain thicknesses, wafer surface roughness can occur and the filling of a small contact holes is difficult due to the formation of voids within the holes.

On the other hand, selective-Al deposition processes selectively deposit aluminum by utilizing a difference in growth rate characteristics between growth on an insulating layer and growth on a conductive layer. This technique is generally unavailable, however, in the case where a blanket metal barrier layer is deposited before the deposition of aluminum to suppress the reaction of aluminum atoms of the aluminum with the silicon atoms of the underlying substrate. The presence of this blanket barrier metal layer prevents the selective formation of the metal interconnection only in the contact holes using the selective-Al deposition process.

A preferential metal deposition (PMD) method for forming metal interconnections in the presence of barrier metal layers is described in commonly assigned U.S. Pat. No. 6,376,355, issued Apr. 23, 2002, the contents of which are incorporated herein by reference.

Referring initially to FIG. 1(a), one embodiment of the PMD process is partially characterized by the deposition of a TiN/Ti film 102 on an upper surface of a dielectric layer 100, and on an interior surface of a contact hole 104 formed in the dielectric layer 100. Reference number 102a denotes a Ti film, and reference number 102b denotes a TiN film. Then, still referring to FIG. 1(a), a material layer 106 is formed over the upper surface only of the TiN/Ti film 102. Examples of the material layer 106 include aluminum, titanium or tantalum. Then, the resultant structure having the material layer 106 is exposed to air or oxygen plasma, thereby at least partially oxidizing the material layer 160 to form an anti-nucleation layer (ANL) 108 as shown in FIG. 1(b). Examples of the ANL 108 include aluminum oxide, titanium oxide or tantalum oxide.

Referring to FIG. 1(c), the resultant structure having the ANL 108 is subjected to a blanket CVD of aluminum. However, aluminum is not CVD deposited over the upper surface of the dielectric layer 100 due to the presence of the ANL 108. Rather, an aluminum layer 110 is selectively formed only on the interior surface of the contact hole 104.

Then, as shown in FIG. 1(d), physical vapor deposition (PVD) of aluminum is carried out, followed by a reflow process, to completely fill of the contact holes in the dielectric layer with aluminum 112.

Use of the PMD process allows for the filling of contact holes having large aspect ratios with aluminum by utilizing the favorable step coverage characteristic of the CVD-Al. One drawback with the PMD process, however, resides in the reduced throughput primarily resulting from formation of an insulating layer as the ANL 108. For example, the deposition of the material layer 106 constitutes an additional process step. Further, a vacuum break is typically made to occur for the purpose of naturally oxidizing the metal layer 106, which also increases processing time.

SUMMARY OF THE INVENTION

According to a first aspect of the present invention, an aluminum wiring is selectively formed within a contact hole or groove of a substrate. An intermediate layer which includes nitrogen is formed over the main surface of a substrate and over the interior surface of the contact hole or groove. A first surface portion of the intermediate layer which is located over the main surface of the substrate is treated with a plasma to form a passivity layer at the first surface portion of the intermediate layer. Then, without an intervening vacuum break, an aluminum film is CVD deposited only over a second surface portion of the intermediate layer which is located over the interior surface of the contact hole or recess. The plasma treatment of the first surface portion of the intermediate layer prevents the CVD deposition of the aluminum film over the first surface portion of the intermediate layer.

According to another aspect of the present invention, an aluminum wiring is selectively formed within a contact hole or groove of a substrate. An intermediate layer which includes nitrogen is formed over the main surface of a substrate and over the interior surface of the contact hole or groove. A first surface portion of the intermediate layer which is located over the main surface of the substrate is treated with a plasma to form a passivity layer at the first surface portion of the intermediate layer. Then, without an intervening vacuum break, an aluminum film is CVD deposited only over a second surface portion of the intermediate layer which is located over the interior surface of the contact hole or recess. The plasma treatment of the first surface portion of the intermediate layer prevents the CVD deposition of the aluminum film over the first surface portion of the intermediate layer. Then, still without an intervening vacuum break, an aluminum layer over the passivity layer and over the aluminum film so as to fill the contact hole or groove.

According to still another aspect of the present invention, an aluminum wiring is selectively formed within a contact hole or groove of a substrate. A first intermediate layer is formed over the main surface of a substrate and over the interior surface of the contact hole or groove. Then, a second intermediate layer which includes nitrogen is formed over the first intermediate layer. A first surface portion of the second intermediate layer which is located over the main surface of the substrate is treated with a plasma to form a passivity layer at the first surface portion of the intermediate layer. Then, without an intervening vacuum break, an aluminum film is CVD deposited only over a second surface portion of the second intermediate layer which is located over the interior surface of the contact hole or recess. The plasma treatment of the first surface portion of the second intermediate layer prevents the CVD deposition of the aluminum film over the first surface portion of the second intermediate layer. Then, still without an intervening vacuum break, an aluminum layer over the passivity layer and over the aluminum film so as to fill the contact hole or groove.

According to yet another aspect of the present invention, an aluminum wiring is selectively formed within a contact hole or groove of a substrate. An intermediate layer with includes nitrogen is formed over the main surface of a substrate and over the interior surface of the contact hole or groove. Then, the intermediate layer is partially etched to obtain a partially etched intermediate layer. A first surface portion of the partially etched intermediate layer which is located over the main surface of the substrate is treated with a plasma to form a passivity layer at the first surface portion of the partially etched intermediate layer. Then, without an intervening vacuum break, an aluminum film is CVD deposited only over a second surface portion of the partially etched intermediate layer which is located over the interior surface of the contact hole or recess. The plasma treatment of the first surface portion of the partially etched intermediate layer prevents the CVD deposition of the aluminum film over the first surface portion of the partially etched intermediate layer. Then, still without an intervening vacuum break, an aluminum layer over the passivity layer and over the aluminum film so as to fill the contact hole or groove.

BRIEF DESCRIPTION OF THE DRAWINGS

The above and other aspects and advantages of the present invention will become more readily understood from the detailed description that follows, with reference to the accompanying drawings, in which.

DETAILED DESCRIPTION OF THE PREFERRED EMBODIMENTS

Figure 1A:
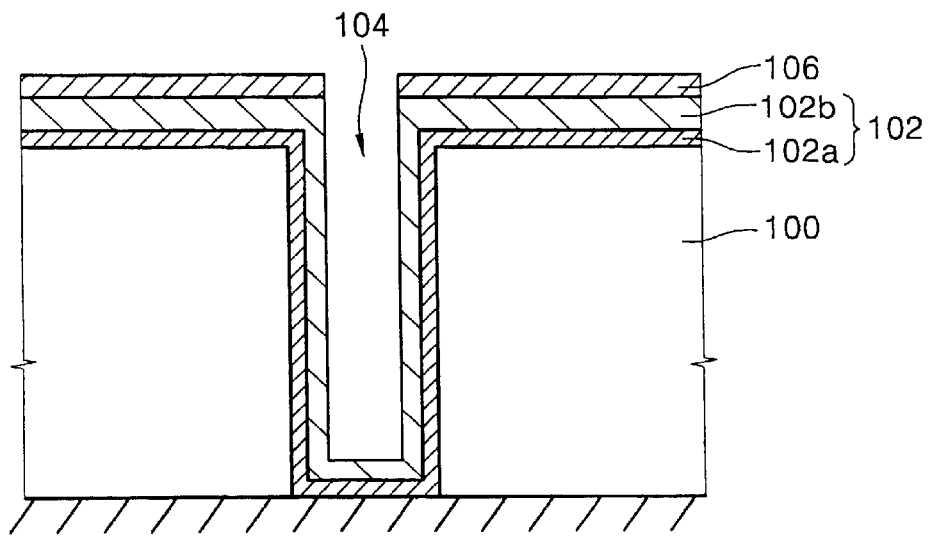
FIGS. 1(a) through 1(d) are sectional views for describing a preferential metal deposition (PMD) process.
Figure 1B:
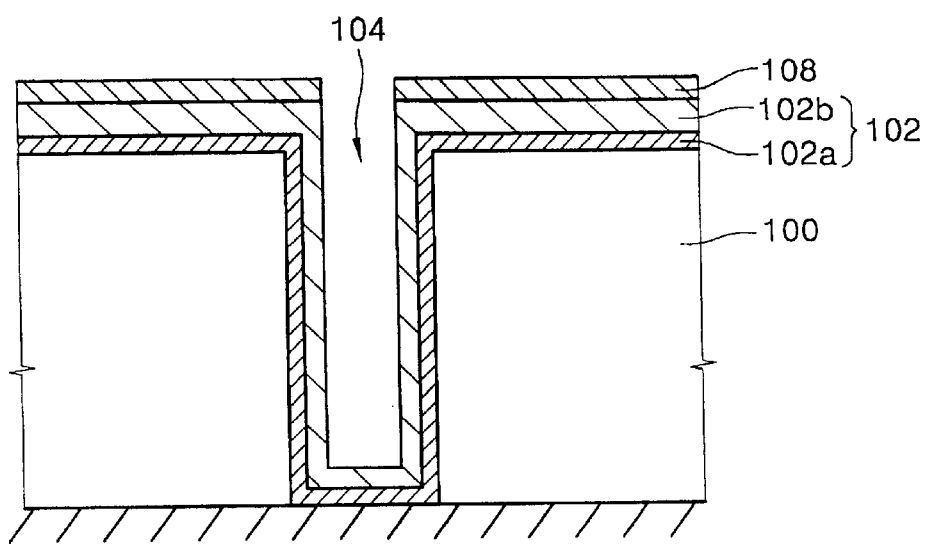
Figure 1C:
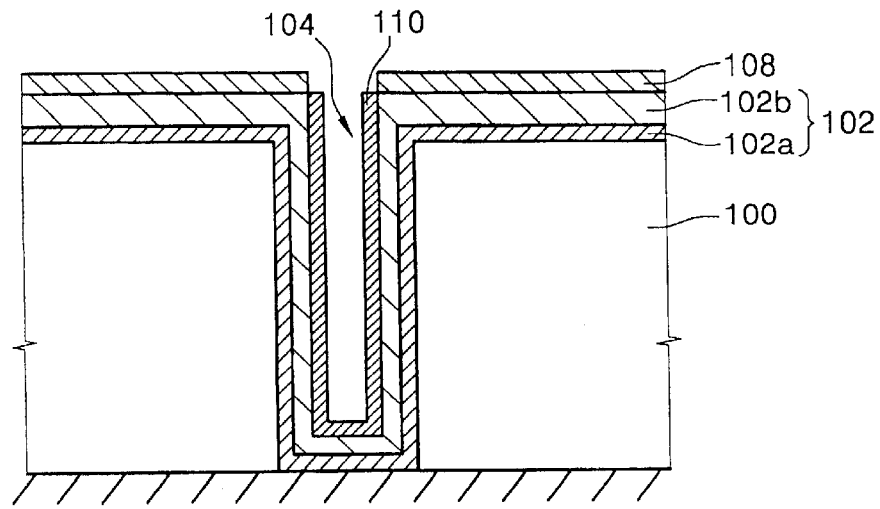
Figure 1D:
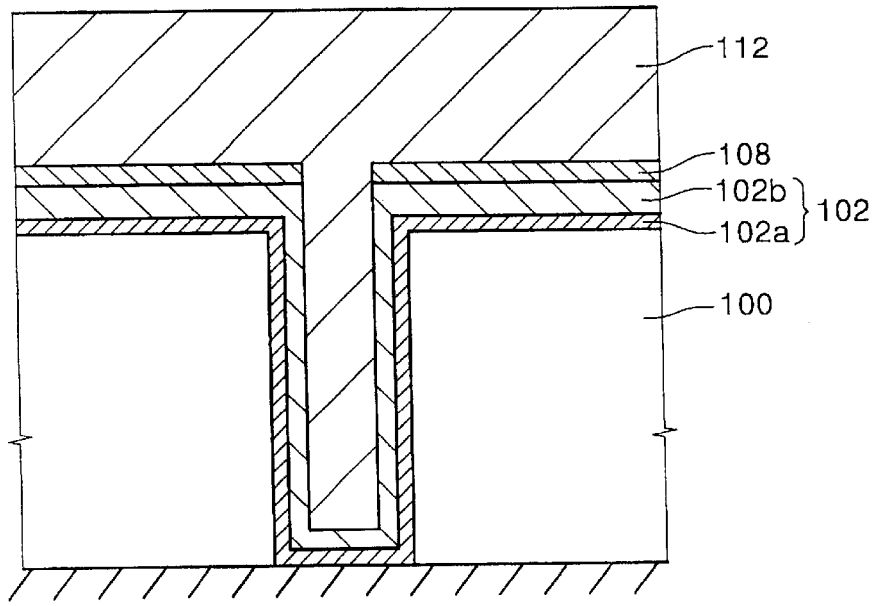

The present invention is at least partially characterized by subjecting a wetting or barrier layer at the exterior of a contact hole (or recess, groove, etc.) to a passivity treatment using a plasma. The passivity is effective to prevent deposition of aluminum on the treated layer at the exterior of the contact hole during a subsequent CVD-Al process, but allows a thin aluminum layer to be deposited at the interior of the contact hole. As such, it is not necessary to deposit an additional insulating layer as an anti-nucleation layer, and further, a vacuum break between the passivity treatment and the CVD-Al process can be avoided. In this manner, throughput is enhanced.

The invention will now be described in detail with reference to several non-limiting embodiments thereof.

Reference is initially made to FIGS. 2(a) through 2(d) which are sectional views for describing a metal deposition process according to a first embodiment of the present invention. An intermediate layer 202 (i.e., a wetting layer or barrier layer) which includes nitrogen (N) is formed over the main surface of a substrate 200 and over the interior surface of a contact hole or groove 204. In this embodiment, by way of example, the intermediate layer 202 is a TiN/Ti film, and the substrate 200 is a dielectric layer formed over the surface of a semiconductor layer or over the surface of a metal layer. In this case, reference number 202a of FIG. 2(a) denotes a Ti film, and reference number 202b denotes a TiN film.

Figure 2A:
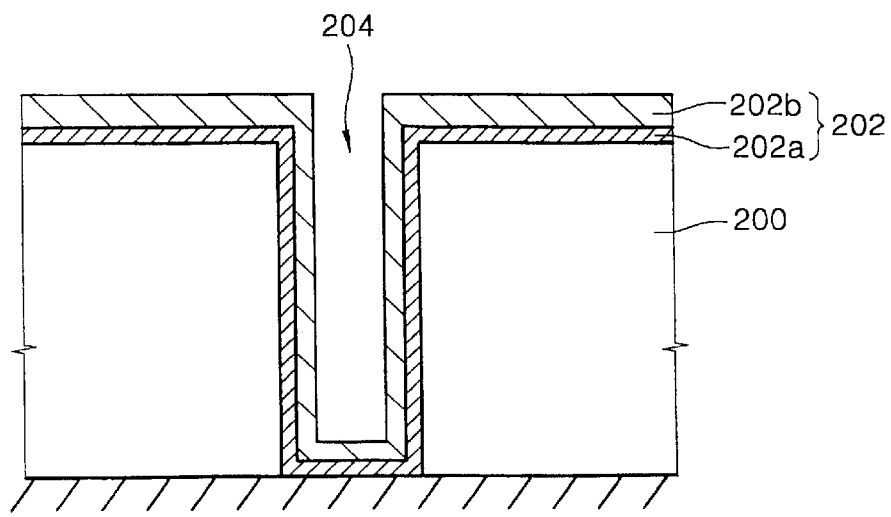
FIGS. 2(a) through 2(d) are sectional views for describing a metal deposition process according to an embodiment of the present invention.
Figure 2B:
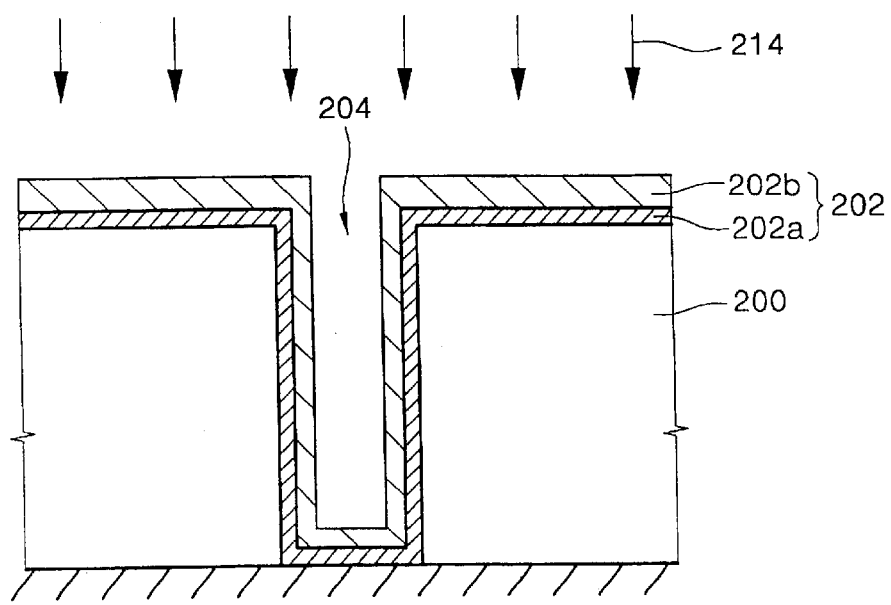
Figure 2C:
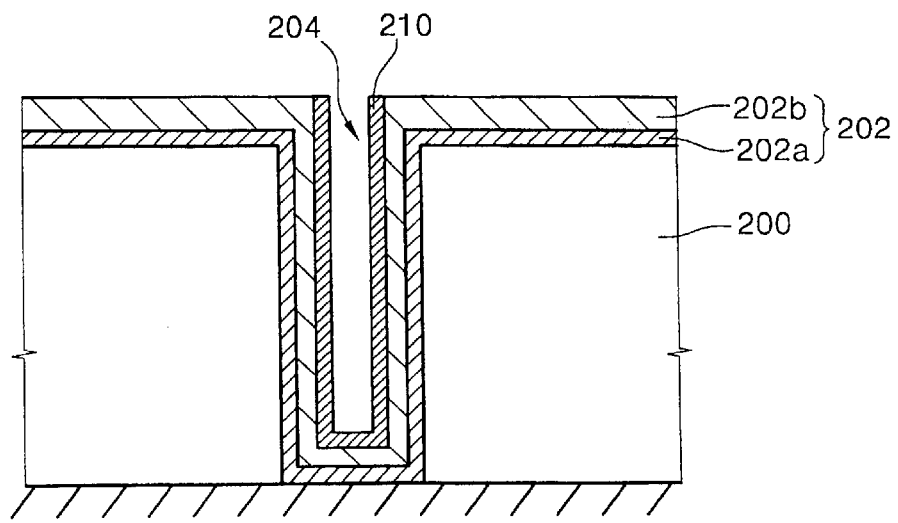
Figure 2D:
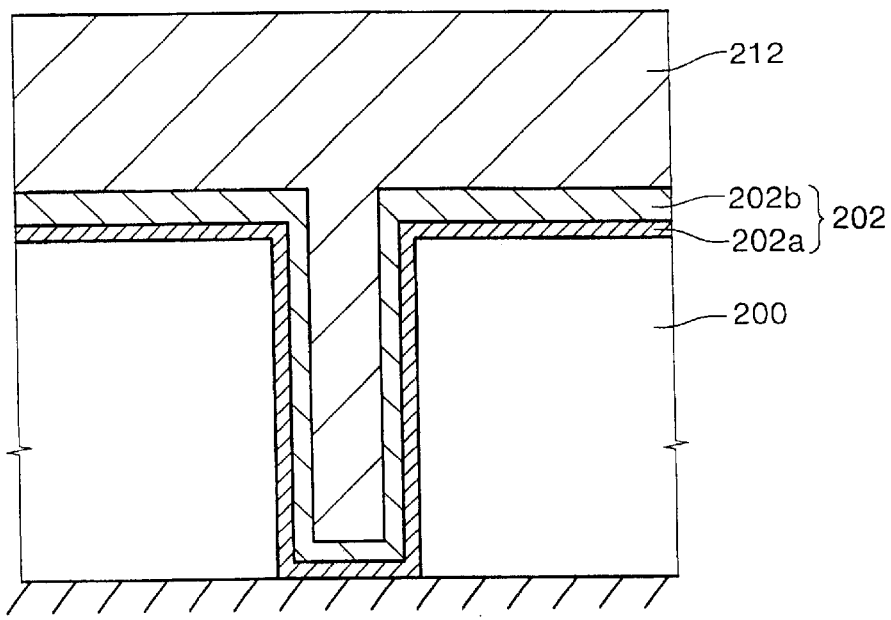

At this point, in a PMD process of U.S. Pat. No. 6,376,355 discussed above, the material layer 106 would then be deposited, and at least a surface portion thereof would be oxidized to obtain an anti-nucleation layer (ANL) 108. In contrast, according to the present embodiment as represented in FIG. 2(b), an upper surface portion of the Ti/TiN film 202 which is located over the main surface of the dielectric layer 200 is treated with plasma 214 to form a passivity layer at the upper surface portion of the Ti/TiN film 202. Due to characteristics of the plasma treatment, the interior surface portion of the Ti/TiN film 202 within the contact hole 204 is not substantially treated and no effective passivity occurs. The passivity forms an anti-nucleation layer at the upper surface of the Ti/TiN layer 202 which in turn prevents deposition of aluminum in a subsequent CVD-Al process. Thus, as shown in FIG. 2(c), a CVD-Al process is carried out to deposit an aluminum film 210 on the Ti/TiN film 202 only within the contact hole 204. Then, as shown in FIG. 2(d), physical vapor deposition (PVD) of aluminum is carried out, followed by a reflow process, to completely fill of the contact hole in the dielectric layer with aluminum 212.

Preferably, to increase throughput, the formation of the Ti/TiN film 202, the plasma treatment, and CVD-Al deposition are conducted without an intervening vacuum break. Also preferably, the plasma treatment and CVD-Al deposition are conducted in a same reacting chamber.

The intermediate layer may be made of materials other than Ti/TiN, and as examples, TiN, TaN, Ta/TaN, Ti/TaN, and Ta/TiN layers may be utilized.

The plasma is preferably a nitrogen-containing plasma such as an $N_2$ plasma, but other plasmas such as an $NH_3$ plasma or an Ar plasma may be used. Preferably, a nitrogen plasma is obtain by introducing Ar and $N_2$ into a chamber at a pressure of 0.1 to 5 torr and at a plasma power of 50 to 300 watts, where a flow rate of the Ar is 50 to 1000 sccm and a flow rate of the $N_2$ is 50 to 1000 sccm.

Examples of precursor used in the CVD-Al deposition of the aluminum film include MPA, DMEAA or DMAH.

Although not so limited, the present invention can allow for the filling of contact holes having diameters of less than 0.5 µm and/or aspect ratios of more than 2.

A second embodiment of the present invention will now be described with reference to the flow chart of FIG. 3. At 301, an intermediate layer which includes nitrogen (N) is formed over the main surface of a substrate and over the interior surface of a contact hole or groove. In this example, the intermediate layer is a Ti/TiN barrier metal layer, although other material layers as noted in the first embodiment may be used. Then, at 302, an upper surface portion of the intermediate layer which is located over the main surface of the substrate is treated with a plasma to form a passivity layer at the first surface portion of the intermediate layer. Next, at 303, an aluminum film is CVD-Al deposited only over an interior surface portion of the Ti/TiN layer which is located over the interior surface of the contact hole or groove. As in the first embodiment, plasma treatment of the first surface portion of the intermediate layer prevents the CVD-Al deposition of the aluminum film over the upper surface portion of the intermediate layer. Then, at 304, physical vapor deposition (PVD) of aluminum is carried out, followed by a reflow process, to completely fill of the contact hole in the substrate with aluminum.

Figure 3:
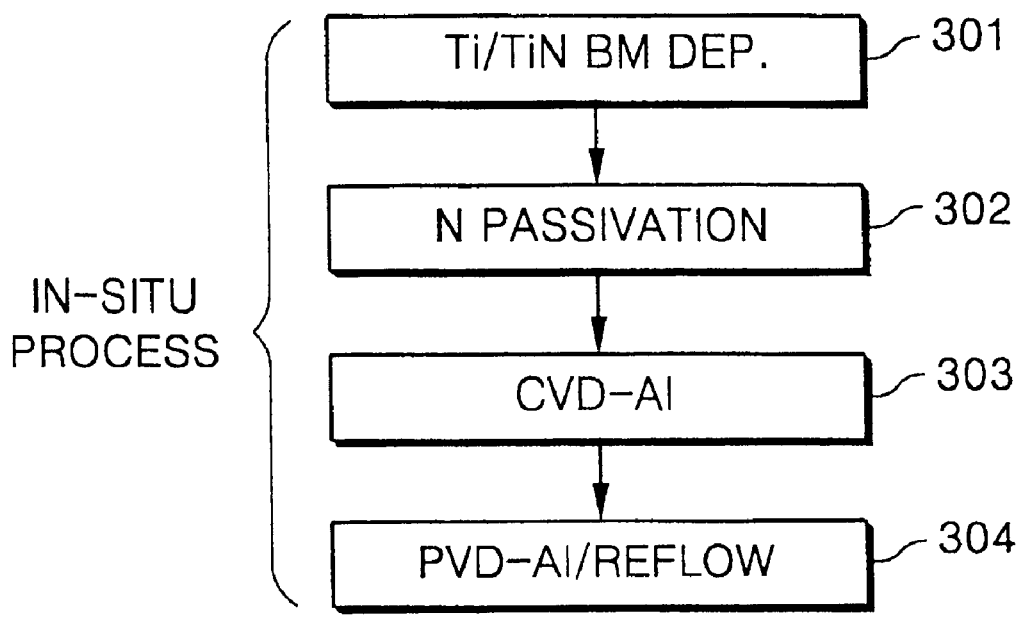
FIG. 3 is a flow diagram showing a process sequence according to another embodiment of the present invention.

In the second embodiment, at least the plasma treatment and the CVD-Al deposition are conducted without an intervening vacuum break, and preferably, all the processes 301 through 304 of FIG. 3 are conducted without an intervening vacuum break. Also preferably, at least the plasma treatment and the CVD-Al deposition are conducted within a same reacting chamber.

A third embodiment of the present invention will now be described with reference to the flow chart of FIG. 4. Here, at 401, a first intermediate layer is formed over the main surface of a substrate and over the interior surface of a contact hole or groove. In this example, the first intermediate layer is a Ti/TiN barrier metal layer, although other material layers may be used, such as Ti, Ti/TiN, Ta, Ta/TaN, Ti/TaN, Ta/TiN, Ta/Ti and Ti/Ta. Then, at 402, a second intermediate layer is formed over the first intermediate layer. In this example, the second intermediate layer is a thin TiN layer. Again, however, other layers may be used. Next, at 403, an upper surface portion of the thin TiN layer which is located over the main surface of the substrate is treated with a plasma to form a passivity layer at the upper surface portion of the thin layer. Next, at 404, an aluminum film is CVD-Al deposited only over an interior surface portion of the thin TiN layer which is located over the interior surface of the contact hole or groove. As in the first embodiment, plasma treatment of the upper surface portion of the thin TiN layer prevents the CVD-Al deposition of the aluminum film over the upper surface portion of the thin TiN layer. Then, at 405, physical vapor deposition (PVD) of aluminum is carried out, followed by a reflow process, to completely fill of the contact hole in the substrate with aluminum.

Figure 4:
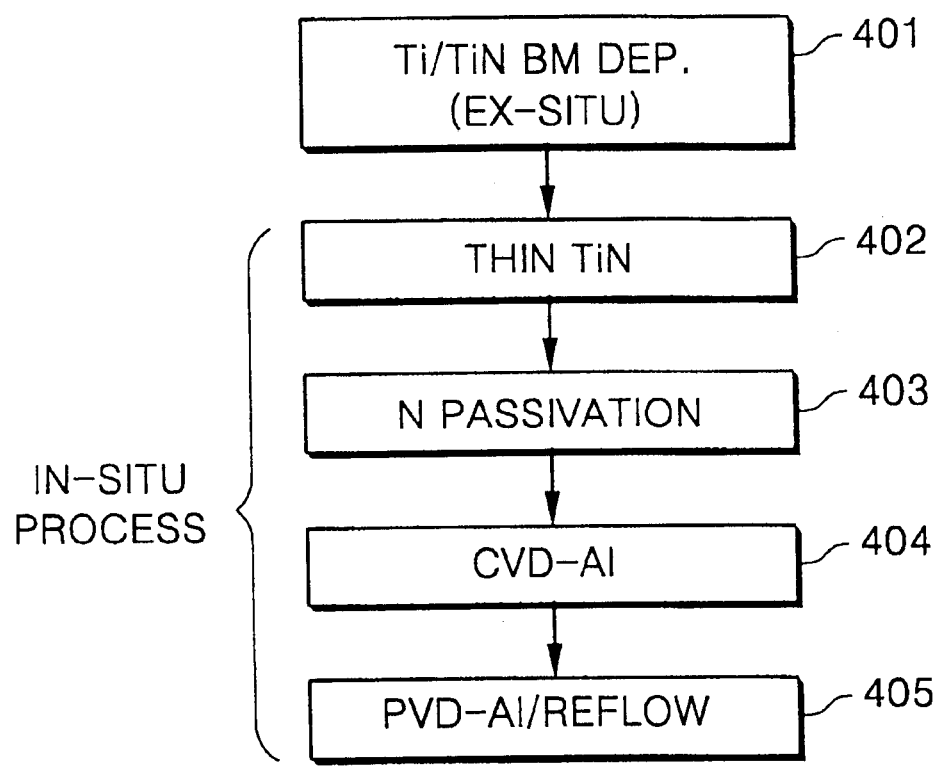
FIG. 4 is a flow diagram showing a process sequence according to still another embodiment of the present invention.

In the third embodiment, at least the plasma treatment and the CVD-Al deposition are conducted without an intervening vacuum break, and preferably, the processes 402 through 405 of FIG. 4 are conducted without an intervening vacuum break. Also preferably, at least the plasma treatment and the CVD-Al deposition are conducted within a same reacting chamber.

A fourth embodiment of the present invention will now be described with reference to the flow chart of FIG. 5. Here, at 501, an intermediate layer is formed over the main surface of a substrate and over the interior surface of a contact hole or groove. In this example, the intermediate layer is a Ti/TiN barrier metal layer, although other material layers as noted in the first embodiment may be used. Then, at 502, the intermediate layer is subjected to etching to define an etched Ti/TiN barrier metal layer. Next, at 503, an upper surface portion of the etched Ti/TiN layer which is located over the main surface of the substrate is treated with a plasma to form a passivity layer at the upper surface portion of the thin layer. Then, at 504, an aluminum film is CVD-Al deposited only over an interior surface portion of the etched Ti/TiN layer which is located over the interior surface of the contact hole or groove. As in the first embodiment, plasma treatment of the upper surface portion of the thin TiN layer prevents the CVD-Al deposition of the aluminum film over the upper surface portion of the thin TiN layer. Then, at 505, physical vapor deposition (PVD) of aluminum is carried out, followed by a reflow process, to completely fill of the contact hole in the substrate with aluminum.

Figure 5:
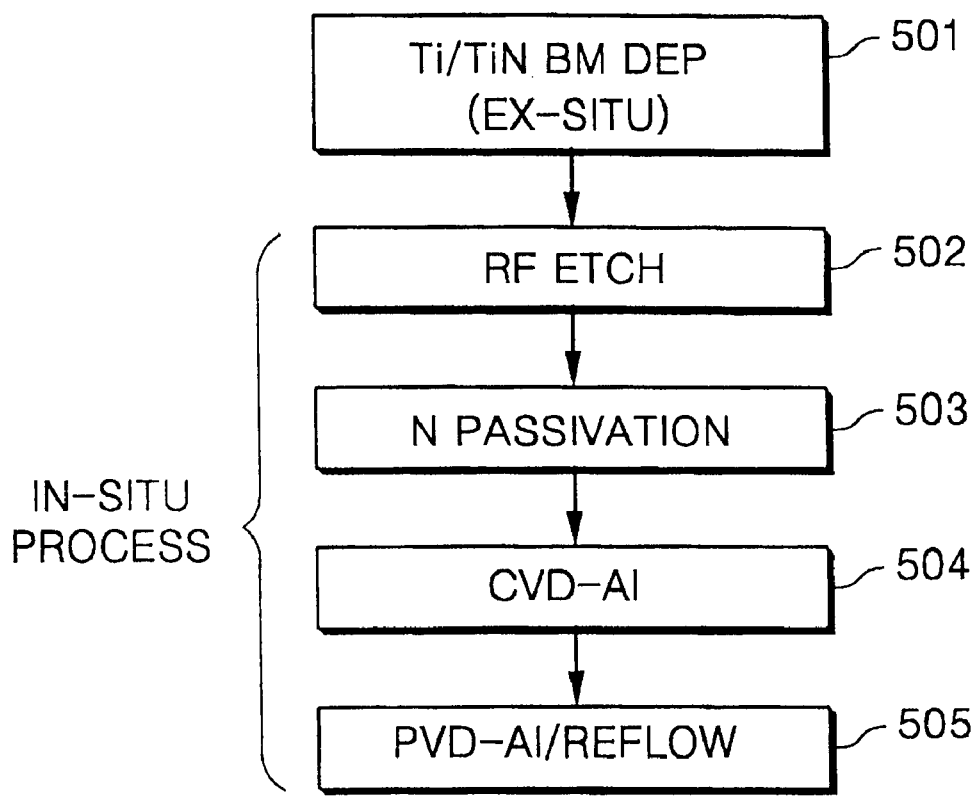
FIG. 5 is a flow diagram showing a process sequence according to yet another embodiment of present invention.

In the fourth embodiment, at least the plasma treatment and the CVD-Al deposition are conducted without an intervening vacuum break, and preferably, the processes 502 through 505 of FIG. 5 are conducted without an intervening vacuum break. Also preferably, at least the plasma treatment and the CVD-Al deposition are conducted within a same reacting chamber.

A number of test process sequences were conducted to confirm the anti-nucleation properties resulting from the plasma treatment according to the invention. Without intending to limit the scope of the invention in any way, results of the test process sequences are shown in the table below:

| Sequence | Result |
| --- | --- |
| 1 CDS TiN → $N_2$ plasma → CVD-Al | No CVD-Al Dep. |
| 2 CDS TiN → $N_2$ Flushing → CVD-Al | Normal CVD-Al Dep. |
| 3 CDS TiN → $N_2$ plasma → vacuum break → CVD-Al | Normal CVD-Al Dep. |
| 4 CDS TiN → $N_2$ plasma → standing under vacuum for 120 sec. → CVD-Al | No CVD-Al Dep. |
| 5 CDS Ti → $N_2$ plasma → CVD-Al | Normal CVD-Al Dep. |
| 6 CDS TiN → vacuum break → $N_2$ plasma → CVD-Al | Non-uniform Dep. |
| 7 CVD TiN → vacuum break → $N_2$ plasma → CVD-Al | Non-uniform Dep. |
| 8 CDS TiN → vacuum break → CDS TiN → $N_2$ plasma → CVD-Al | No CVD-Al Dep. |
| 9 CVD TiN → vacuum break → CDS TiN → $N_2$ plasma → CVD-Al | No CVD-Al Dep. |

As demonstrated in the table above, deposition and plasma treatment of the TiN layer followed by CVD-Al in the absence of an intervening vacuum break results in no deposition of aluminum, thereby confirming the anti-nucleation properties of the plasma treated TiN film.

In the drawings and specification, there have been disclosed typical preferred embodiments of this invention and, although specific terms are employed, they are used in a generic and descriptive sense only and not for purposes of limitation, the scope of the present invention being set forth in the following claims.

What is claimed is:

1. A method of forming an aluminum wiring within a contact hole or groove of a substrate, wherein the substrate includes an upper main surface and wherein the contact hole or groove is defined by an interior surface extending below the upper main surface of the substrate, said method comprising:

forming an intermediate layer which includes nitrogen over the main surface of a substrate and over the interior surface of the contact hole or groove;

treating a first surface portion of the intermediate layer which is located over the main surface of the substrate with a plasma to form a passivity layer at the first surface portion of the intermediate layer; and chemical vapor deposition (CVD) depositing an aluminum film only over a second surface portion of the intermediate layer which is located over the interior surface of the contact hole or groove, wherein said treating with plasma of the first surface portion of the intermediate layer prevents the CVD depositing of the aluminum film over the first surface portion of the intermediate layer;

wherein said treating with a plasma and said CVD depositing are conducted without an intervening vacuum break.

2. The method as claimed in claim 1, wherein said forming an intermediate layer, said treating with plasma and said CVD depositing are conducted without an intervening vacuum break.

3. The method as claimed in claim 1, wherein said treating with a plasma and said CVD depositing are conducted within a same reacting chamber.

4. The method as claimed in claim 1, wherein the intermediate layer is one selected from the group consisting of TiN, TaN, Ta/TaN, Ti/TaN, and Ta/TiN layers.

5. The method as claimed in claim 1, wherein the intermediate layer is a Ti/TiN layer.

6. The method as claimed in claim 1, wherein the plasma is an $N_2$ plasma.

7. The method as claimed in claim 1, wherein the $N_2$ plasma is obtained by introducing Ar and $N_2$ into a chamber.

8. The method as claimed in claim 7, wherein the Ar and $N_2$ are introduced at a pressure of 0.1 to 5 torr, and wherein a flow rate of the Ar is 50 to 1000 sccm and a flow rate of the $N_2$ is 50 to 1000 sccm.

9. The method as claimed in claim 8, wherein a plasma power is 50 to 300 watts.

10. The method as claimed in claim 1, wherein the plasma is an $NH_3$ plasma.

11. The method as claimed in claim 1, wherein the plasma is an Ar plasma.

12. The method as claimed in claim 1, wherein the aluminum film is CVD deposited using MPA, DMEAA or DMAH as a precursor.

13. The method as claimed in claim 1, further comprising depositing an aluminum layer over the passivity layer and over the aluminum film so as to fill the contact hole or groove.

14. The method as claimed in claim 13, wherein the aluminum layer is deposited by physical vapor deposition (PVD) and a reflow process.

15. The method as claimed in claim 1, wherein a diameter of the contact hole is less than 0.5 $\mu$.

16. The method as claimed in claim 1, wherein an aspect ratio of the contact hole is more than 2.

17. A method of forming an aluminum wiring within a contact hole or groove of a substrate, wherein the substrate includes an upper main surface and wherein the contact hole or groove is defined by an interior surface extending below the upper main surface of the substrate, said method comprising:

forming an intermediate layer which includes nitrogen over the main surface of a substrate and over the interior surface of the contact hole or groove;

treating a first surface portion of the intermediate layer which is located over the main surface of the substrate with a plasma to form a passivity layer at the first surface portion of the intermediate layer; and chemical vapor deposition (CVD) depositing an aluminum film only over a second surface portion of the intermediate layer which is located over the interior surface of the contact hole or groove, wherein said treating with plasma of the first surface portion of the intermediate layer prevents the CVD depositing of the aluminum film over the first surface portion of the intermediate layer;

depositing an aluminum layer over the passivity layer and over the aluminum film so as to fill the contact hole or groove;

wherein said forming an intermediate layer, said treating with a plasma, and said CVD-Al depositing are conducted without an intervening vacuum break.

18. The method as claimed in claim 17, wherein said forming an intermediate layer, said treating with a plasma, said CVD depositing, and said depositing an aluminum layer are conducted without an intervening vacuum break.

19. The method as claimed in claim 18, wherein said treating with a plasma and said CVD depositing are conducted within a same reactor chamber.

20. The method as claimed in claim 17, wherein the intermediate layer is one selected from the group consisting of TiN, TaN, Ta/TaN, Ti/TaN, and Ta/TiN layers.

21. The method as claimed in claim 17, wherein the intermediate layer is a Ti/TiN layer.

22. The method as claimed in claim 17, wherein the plasma is an $N_2$ plasma.

23. The method as claimed in claim 17, wherein the aluminum layer is deposited by physical vapor deposition (PVD) and a reflow process.

24. The method as claimed in claim 17, wherein a diameter of the contact hole is less than 0.5 $\mu$.

25. The method as claimed in claim 17, wherein an aspect ratio of the contact hole is more than 2.

26. A method of forming an aluminum wiring within a contact hole or groove of a substrate, wherein the substrate includes an upper main surface and wherein the contact hole or groove is defined by an interior surface extending below the upper main surface of the substrate, said method comprising:

forming a first intermediate layer over the main surface of a substrate and over the interior surface of the contact hole or groove;

forming a second intermediate layer which includes nitrogen over first intermediate layer;

treating a first surface portion of the second intermediate layer which is located over the main surface of the substrate with a plasma to form a passivity layer at the first surface portion of the second intermediate layer; and chemical vapor deposition (CVD) depositing an aluminum film only over a second surface portion of the second intermediate layer which is located over the interior surface of the contact hole or groove, wherein said treating with plasma of the first surface portion of the second intermediate layer prevents the CVD depositing of the aluminum film over the first surface portion of the second intermediate layer;

depositing an aluminum layer over the passivity layer and over the aluminum film so as to fill the contact hole or groove;

wherein said forming a second intermediate layer, said treating with a plasma, and said CVD depositing are conducted without an intervening vacuum break.

27. The method as claimed in claim 26, wherein said forming a second intermediate layer, said treating with a plasma, said CVD depositing, and said depositing an aluminum layer are conducted without an intervening vacuum break.

28. The method as claimed in claim 26, wherein said treating with a plasma and said CVD depositing are conducted within a same reactor chamber.

29. The method as claimed in claim 26, wherein the first intermediate layer is selected from the group consisting of Ti, Ti/TiN, Ta, Ta/TaN, Ti/TaN, Ta/TiN, Ta/Ti and Ti/Ta.

30. The method as claimed in claim 26, wherein the second intermediate layer is one selected from the group consisting of TiN, TaN, Ta/TaN, Ti/TaN, and Ta/TiN layers.

31. The method as claimed in claim 26, wherein the second intermediate layer is a Ti/TiN layer.

32. The method as claimed in claim 26, wherein the plasma is an $N_2$ plasma.

33. The method as claimed in claim 26, wherein the aluminum layer is deposited by physical vapor deposition (PVD) and a reflow process.

34. The method as claimed in claim 26, wherein a diameter of the contact hole is less than 0.5 $\mu$.

35. The method as claimed in claim 26, wherein an aspect ratio of the contact hole is more than 2.

36. The method as claimed in claim 26, wherein there is an intervening vacuum break between said forming the first intermediate layer and said forming the second intermediate layer.

37. A method of forming an aluminum wiring within a contact hole or groove of a substrate, wherein the substrate includes an upper main surface and wherein the contact hole or groove is defined by an interior surface extending below the upper main surface of the substrate, said method comprising:

forming an intermediate layer which includes nitrogen over the main surface of a substrate and over the interior surface of the contact hole or groove;

partially etching the intermediate layer to obtain a partially etched intermediate layer;

treating a first surface portion of the partially etched intermediate layer which is located over the main surface of the substrate with a plasma to form a passivity layer at the first surface portion of the partially etched intermediate layer; and chemical vapor deposition (CVD) depositing an aluminum film only over a second surface portion of the partially etched intermediate layer which is located over the interior surface of the contact hole or groove, wherein said treating with plasma of the first surface portion of the partially etched intermediate layer prevents the CVD-Al depositing of the aluminum film over the first surface portion of the partially etched intermediate layer;

depositing an aluminum layer over the passivity layer and over the aluminum film so as to fill the contact hole or groove;

wherein said partially etching the intermediate layer, said treating with a plasma, and said CVD depositing are conducted without an intervening vacuum break.

38. The method as claimed in claim 37, wherein said etching the intermediate layer, said treating with a plasma, said CVD depositing, and said depositing an aluminum layer are conducted without an intervening vacuum break.

39. The method as claimed in claim 37, wherein said treating with a plasma and said CVD depositing are conducted within a same reactor chamber.

40. The method as claimed in claim 37, wherein the second intermediate layer is one selected from the group consisting of TiN, TaN, Ta/TaN, Ti/TaN, and Ta/TiN layers.

41. The method as claimed in claim 37, wherein the intermediate layer is a Ti/TiN layer.

42. The method as claimed in claim 37, wherein the plasma is an $N_2$ plasma.

43. The method as claimed in claim 37, wherein the aluminum layer is deposited by physical vapor deposition (PVD) and a reflow process.

44. The method as claimed in claim 37, wherein a diameter of the contact hole is less than 0.5 $\mu$.

45. The method as claimed in claim 37, wherein an aspect ratio of the contact hole is more than 2 .

46. The method as claimed in claim 37, wherein there is an intervening vacuum break between said forming the intermediate layer and said partially etching the intermediate layer.

* * * * *